(12) United States Patent
Goodwin et al.

(10) Patent No.: US 7,678,429 B2
(45) Date of Patent: Mar. 16, 2010

(54) PROTECTIVE COATING COMPOSITION

(75) Inventors: Andrew James Goodwin, Co Cork (IE);
Stuart Leadley, Co Cork (IE); Seamus Paul Ryan, Co Cork (IE)

(73) Assignee: Dow Corning Corporation, Midland, MI (US)

( * ) Notice: Subject to any disclaimer, the term of this patent is extended or adjusted under 35 U.S.C. 154(b) by 992 days.

(21) Appl. No.: 10/510,555

(22) PCT Filed: Apr. 8, 2003

(86) PCT No.: PCT/EP03/04346

§ 371 (c)(1),
(2), (4) Date: Oct. 7, 2004

(87) PCT Pub. No.: WO03/086030

PCT Pub. Date: Oct. 16, 2003

(65) Prior Publication Data

US 2005/0158480 A1    Jul. 21, 2005

(30) Foreign Application Priority Data

Apr. 10, 2002    (GB)    ................................ 0208261.8
Apr. 10, 2002    (GB)    ................................ 0208263.4

(51) Int. Cl.
*B05D 7/00*    (2006.01)
*H05H 1/00*    (2006.01)

(52) U.S. Cl. ........................ 427/569; 427/212; 427/561; 427/562

(58) Field of Classification Search .................. 427/212, 427/569, 488, 561, 562
See application file for complete search history.

(56) References Cited

U.S. PATENT DOCUMENTS

| 3,247,014 | A | * | 4/1966 | Goldberger et al. ......... 427/450 |
| 4,212,719 | A | | 7/1980 | Osada et al. |
| 4,568,605 | A | | 2/1986 | Duffer et al. |
| 4,582,746 | A | | 4/1986 | Shirahata et al. |
| 4,588,641 | A | | 5/1986 | Haque et al. |
| 4,929,319 | A | | 5/1990 | Dinter et al. |
| 5,026,463 | A | | 6/1991 | Dinter et al. |

(Continued)

FOREIGN PATENT DOCUMENTS

CN            1123341 A       5/1996

(Continued)

OTHER PUBLICATIONS

English translation of portions of CN 1123341A considered to be material, Feng Anwen, published on May 29, 1996, 6 pages.

(Continued)

*Primary Examiner*—Timothy H Meeks
*Assistant Examiner*—Cachet I Sellman
(74) *Attorney, Agent, or Firm*—Howard & Howard Attorneys PLLC

(57) ABSTRACT

A method of forming a coating on a powdered substrate, which method comprises introducing an atomized liquid and/or solid coating forming material and separately transporting a powdered substrate to be coated into an atmospheric plasma discharge and/or an ionized gas stream resulting therefrom, and exposing the powdered substrate to the atomized liquid and/or solid coating forming material.

16 Claims, 3 Drawing Sheets

U.S. PATENT DOCUMENTS

| | | | |
|---|---|---|---|
| 5,041,304 A | | 8/1991 | Kusano et al. |
| 5,185,132 A | | 2/1993 | Horiike et al. |
| 5,290,378 A | | 3/1994 | Kusano et al. |
| 5,340,454 A | | 8/1994 | Schaefer et al. |
| 5,340,618 A | * | 8/1994 | Tanisaki et al. ............ 427/488 |
| 5,366,770 A | | 11/1994 | Wang |
| 5,399,832 A | | 3/1995 | Tanisaki et al. |
| 5,414,324 A | * | 5/1995 | Roth et al. ............ 315/111.21 |
| 5,484,645 A | * | 1/1996 | Lickfield et al. ............ 428/198 |
| 5,529,631 A | | 6/1996 | Yoshikawa et al. |
| 5,543,017 A | | 8/1996 | Uchiyama et al. |
| 5,620,743 A | | 4/1997 | Harth et al. |
| 5,835,677 A | | 11/1998 | Li et al. |
| 5,876,753 A | | 3/1999 | Timmons et al. |
| 5,944,901 A | | 8/1999 | Landes et al. |
| 6,086,710 A | | 7/2000 | Miyashita et al. |
| 6,176,982 B1 | * | 1/2001 | Rickerby ............ 204/192.15 |
| 6,241,858 B1 | * | 6/2001 | Phillips et al. ......... 204/192.15 |
| 6,285,032 B1 | | 9/2001 | Hahne et al. |
| 6,331,689 B1 | | 12/2001 | Branston et al. |
| 6,342,275 B1 | | 1/2002 | Miyakawa et al. |
| 6,368,665 B1 | | 4/2002 | Hunt et al. |
| 6,396,214 B1 | | 5/2002 | Grosse et al. |
| 6,613,394 B2 | | 9/2003 | Kuckertz et al. |
| 6,705,127 B1 | | 3/2004 | Cain et al. |
| 6,746,721 B1 | | 6/2004 | Moser |
| 6,800,336 B1 | | 10/2004 | Fonrsel et al. |
| 2001/0020448 A1 | | 9/2001 | Vaartstra et al. |
| 2002/0015797 A1 | | 2/2002 | Hunt et al. |
| 2002/0129902 A1 | | 9/2002 | Babayan et al. |
| 2002/0192057 A1 | | 12/2002 | Meulen |
| 2004/0022945 A1 | * | 2/2004 | Goodwin et al. ....... 427/255.27 |
| 2004/0050685 A1 | | 3/2004 | Yara et al. |
| 2004/0052028 A1 | * | 3/2004 | O'Reilly et al. ............ 361/120 |
| 2005/0178330 A1 | | 8/2005 | Goodwin et al. |
| 2005/0214476 A1 | | 9/2005 | Goodwin et al. |
| 2005/0241582 A1 | | 11/2005 | Dobbyn et al. |
| 2007/0166479 A1 | | 7/2007 | Drake et al. |
| 2008/0118734 A1 | | 5/2008 | Goodwin et al. |

FOREIGN PATENT DOCUMENTS

| | | |
|---|---|---|
| DE | 19546187 | 6/1997 |
| DE | 19742619 | 1/1999 |
| DE | 19924108 | 11/2000 |
| DE | 19955880 | 5/2001 |
| EP | 0431951 | 6/1991 |
| EP | 0617142 | 9/1994 |
| EP | 0809275 | 11/1997 |
| EP | 0896035 | 2/1999 |
| EP | 1326718 | 7/2003 |
| FR | 2713511 | 6/1995 |
| GB | 2252559 | 8/1992 |
| GB | 2259185 | 3/1993 |
| GB | 2326165 | 12/1998 |
| JP | 03-115578 | 5/1991 |
| JP | 05168949 | 7/1993 |
| JP | 06000365 | 1/1994 |
| JP | 06228739 | 8/1994 |
| JP | 07-062546 | 3/1995 |
| JP | 07-138761 | 5/1995 |
| JP | 07-328427 | 12/1995 |
| JP | 08-078529 | 3/1996 |
| JP | 10-275698 | 10/1998 |
| JP | 11-029873 | 2/1999 |
| JP | 11-241165 | 9/1999 |
| JP | 2000-192261 | 7/2000 |
| JP | 2000-212753 | 8/2000 |
| JP | 2000-319427 | 11/2000 |
| JP | 2001-087643 | 4/2001 |
| JP | 2002-057440 | 2/2002 |
| WO | WO95/18249 | 7/1995 |
| WO | 97/29156 | 8/1997 |
| WO | WO 9810116 A1 * | 3/1998 |
| WO | WO99/05358 | 2/1999 |
| WO | WO99/06204 | 2/1999 |
| WO | WO99/08803 | 2/1999 |
| WO | WO99/66096 | 12/1999 |
| WO | WO01/38596 | 5/2001 |
| WO | WO01/40359 | 6/2001 |
| WO | WO01/41942 | 6/2001 |
| WO | WO01/59809 | 8/2001 |
| WO | WO01/76773 | 10/2001 |
| WO | 02/28548 | 4/2002 |
| WO | WO02/26401 | 4/2002 |
| WO | 02/35576 | 5/2002 |
| WO | WO02/40742 | 5/2002 |

OTHER PUBLICATIONS

English language abstract for JP03-115578 extracted from searching PJA, Jul. 29, 2008.

English language translation and abstract for JP07-328427, Dec. 19, 1995.

The Cassell Paperback English Dictionary, Cassell Publishers Limited 1990, pages "Infusionism—Ink".

Concise Science Dictionary, Second Edition, Oxford University Press, 1991, pp. 166-167 and 570-571.

O. Goossens et al., "Application Of Atmospheric Pressure Dielectric Barrier Discharges In Deposition, Cleaning And Activation", Surface & Coatings Technology, 142-144 (2001) 474-481.

O. Goossens et al., "The DC Glow Discharge At Atmospheric Pressure", IEEE Transactions On Plasma Science, vol. 30, Feb. 1, 2002, pp. 176-177.

Kanazawa et al., "Glow Plasma Treatment At Atmospheric Pressure For Surface Modification And Film Deposition", Nuclear Instrumetns and Method in Physics Research, 1989, pp. 842-845.

S. Kanazawa et al., "Stable Glow Plasma At Atmospheric Pressure", J. Phys. D: Appl. Phys. 21 (1988) pp. 838-840.

J. Karthikeyan et al, "Plasma Spray Synthesis Of Nanomaterial Powders And Deposits", Materials Science & Engineering A238, (1997) pp. 275-286.

E. E. Kunhardt, "Generation of Large-Volume, Atmospheric-Pressure, Nonequilibrium Plasmas", IEE Transactions on Plasma Science, vol. 28, No. 1, Feb. 2000, pp. 189-200.

Francoise Massines et al., "Experimental And Theoretical Study Of A Glow Discharge At Atmospheric Pressure Controlled By Dielectric Barrier", Journal of Applied Physics, vol. 83, No. 6, Mar. 15, 1998, pp. 2950-2956.

"Neus Primerverfahren für Metalloberflächen zur nachfolgenden UV-Lackerung"; Bolte et al., Coatings Feb. 1998, pp. 38-40.

S. Okazaki et al. ,"Glow Discharge Plasma At Atmospheric Pressure And Its Application", Proc. Jpn. Symp. Plasma Chem./ vol. 2. 1989, pp. 95-102.

Park et al., "Gas Breakdown in an Atmospheric Pressure Radio Frequency Capacitive Plasma Source ", Journal of Applied Physics, vol. 89, No. 1, Jan. 2001.

Plasma Dictionary; Term: Glow Discharge extracted from hhtp://plasmadictionary.llnl.gov/terms lasso?-MaxRecords=1 &SkinRecords=1&Sort, dated Nov. 13, 2006.

J. R.Roth, "Industrial Plasma Engineering", Institute of Physics, London (2001), pp. 55-58.

Jürgen Salge, "Plasma-Assisted Deposition At Atmospheric Pressure", Surface & Coatings Technology 80 (1996) pp. 1-7.

Yasushi Sawada et al. , "Synthesis of Plasma-Polymerized Tetraethoxysilane And Hexamethyldisiloxane Films Prepared By Atmospheric Pressure Glow Discharge", Phys. D: Appl. Phys. 28 (1995) pp. 1661-1669.

Schutze et al. "The Atmospheric-Pressure Plasma Jet: A Review and Comparison . . . ", IEEE Trans on Plasma Science, vol. 26, No. 6, 1998, pp. 1685-1694.

Claire Tendero et al., "Atmospheric Pressure Plasmas: A Review", Spectrochimica Acta Part B, (2005) pp. 1-1.

R. Thyen et al., "Plasma-Enhanced Chemical-Vapour-Deposition Of Thin Films By Corona Discharge At Atmospheric Pressure", Surface & Coatings Technology 97 (1997) pp. 426-434.

Translation of "Neus Primerverfahren für Metalloberflächen zur nachfolgenden UV-Lackerung" (New Primer Process For Metallic Surfaces For Subsequent UV Lacquering), Bolte et al. 5 pages.

T. Yokoyama et al., "The Improvement Of The Atmospheric-Pressure Glow Plasma Method And The Deposition Of Organic Films", J. Phys. D: Appl. Phys. 23, 1990, pp. 374-377.

English language abstract and translation for JP2000-192261, Jul. 11, 2000.

English language abstract and translation for JP2000-319427, Nov. 21, 2000.

English language abstract and translation for JP2001-087643, Apr. 3, 2001.

English language abstract and translation for JP2000-212753, Aug. 2, 2000.

English language abstract and translation for JP07-062546, Mar. 7, 1995.

English language abstract and translation for JP07-138761, May 30, 1995.

English language abstract and translation for JP08-078529, Mar. 22, 1996.

English language abstract and translation for JP10-275698, Oct. 13, 1998.

English language abstract and translation for JP11-029873. Feb. 2, 1999.

English language abstract and translation for JP11-241165, Sep. 7, 1999.

English language abstract and translation for JP2002-057440, Feb. 22, 2002.

English language abstract for DE19546187, Jun. 12, 1997.

English language abstract for DE19742619, Jan. 28, 1999.

English language abstract for DE19924108, Nov. 30, 2000.

English language abstract for DE19955880, May 23, 2001.

English language abstract for FR 2713511, Jun. 16, 1995.

* cited by examiner

US 7,678,429 B2

PROTECTIVE COATING COMPOSITION

CROSS-REFERENCE TO RELATED APPLICATIONS

This present application is a US national stage filing under 35 USC 371 and claims priority from PCT Application No. PCT/EP03/04346 entitled "PROTECTIVE COATING COMPOSITON" filed on 8 Apr. 2003, currently pending, which claims priority from Great Britain Patent Applications No. 0208263.4 and 0208261.8 entitled "PROTECTIVE COATING COMPOSITION", both filed on 10 Apr. 2002.

FIELD OF INVENTION

The present application describes a process for coating powdered particles using atmospheric pressure plasma techniques.

BACKGROUND OF THE INVENTION

When matter is continually supplied with energy, its temperature increases and it typically transforms from a solid to a liquid and, then, to a gaseous state. Continuing to supply energy causes the system to undergo yet a further change of state in which neutral atoms or molecules of the gas are broken up by energetic collisions to produce negatively charged electrons, positive or negatively charged ions and other species. This mix of charged particles exhibiting collective behaviour is called "plasma", the fourth state of matter. Due to their electrical charge, plasmas are highly influenced by external electromagnetic fields, which make them readily controllable. Furthermore, their high energy content allows them to achieve processes which are impossible or difficult through the other states of matter, such as by liquid or gas processing.

The term "plasma" covers a huge range of systems whose density and temperature vary by many orders of magnitude. Some plasmas are very hot and all their microscopic species (ions, electrons, etc.) are in approximate thermal equilibrium, the energy input into the system being widely distributed through atomic/molecular level collisions. Other plasmas, however, particular those at low pressure (e.g. 100 Pa) where collisions are relatively infrequent, have their constituent species at widely different temperatures and are called "non-thermal equilibrium" plasmas. In these non-thermal plasmas the free electrons are very hot with temperatures of many thousands of Kelvin (K) whilst the neutral and ionic species remain cool. Because the free electrons have almost negligible mass, the total system heat content is low and the plasma operates close to room temperature thus allowing the processing of temperature sensitive materials, such as plastics or polymers, without imposing a damaging thermal burden. The hot electrons create, through high energy collisions, a rich source of radicals and excited species with a high chemical potential energy capable of profound chemical and physical reactivity. It is this combination of low temperature operation plus high reactivity which makes non-thermal plasma technologically important and a very powerful tool for manufacturing and material processing as it is capable of achieving processes which, if achievable at all without plasma, would require very high temperatures or noxious and aggressive chemicals.

For industrial applications of plasma technology, a convenient method is to couple electromagnetic power into a volume of process gas, which can be mixtures of gases and vapors in which the workpieces/samples to be treated are immersed or passed through. The gas becomes ionised into plasma, generating chemical radicals, UV-radiation, and ions, which react with the surface of the samples. By correct selection of process gas composition, driving power frequency, power coupling mode, pressure and other control parameters, the plasma process can be tailored to the specific application required by a manufacturer.

Because of the huge chemical and thermal range of plasmas, they are suitable for many technological applications. Non-thermal equilibrium plasmas are particularly effective for surface activation, surface cleaning, material etching and coating of surfaces.

A plasma technology that is rapidly emerging into mainstream industry is that of plasma coating/thin film deposition. Typically, a high level of polymerisation is achieved by application of plasma to monomeric gases and vapors. Thus, a dense, tightly knit and three-dimensionally connected film can be formed which is thermally stable, chemically very resistant and mechanically robust. Such films are deposited conformally on even the most intricate of surfaces and at a temperature, which ensures a low thermal burden on the powdered substrate. Plasmas are therefore ideal for the coating of delicate and heat sensitive, as well as robust materials. Plasma coatings are free of micropores even with thin layers. The optical properties, e.g. colour, of the coating can often be customised and plasma coatings adhere well to even non-polar materials, e.g. polyethylene, as well as steel (e.g. anti-corrosion films on metal reflectors), ceramics, semiconductors, textiles, etc.

Plasma engineering produces a surface effect customised to the desired application or product without affecting the material bulk in any way. Plasma processing thus offers the manufacturer a versatile and powerful tool allowing choice of a material for its bulk technical and commercial properties while giving the freedom to independently engineer its surface to meet a totally different set of needs and confers greatly enhanced product functionality, performance, lifetime and quality which provides the user a significant added value to its production capability.

These properties provide a strong motivation for industry to adopt plasma-based processing, and this move has been led since the 1960s by the microelectronics community which has developed the low pressure Glow Discharge plasma into an ultra-high technology and high capital cost engineering tool for semiconductor, metal and dielectric processing. The same low pressure Glow Discharge type plasma has increasingly penetrated other industrial sectors since the 1980s offering, at more moderate cost, processes such as polymer surface activation for increased adhesion/bond strength, high quality degreasing/cleaning and the deposition of high performance coatings. Thus, there has been a substantial take-up of plasma technology. Glow discharges can be achieved at both vacuum and atmospheric pressures. In the case of atmospheric pressure glow discharge, gases such as helium or argon are utilised as diluents and a high frequency (e.g.>1kHz) power supply is used to generate a homogeneous glow discharge at atmospheric pressure via a Penning ionisation mechanism, (see for example, Kanazawa et al, J.Phys. D: Appl. Phys. 1988, 21, 838, Okazaki et al, Proc. Jpn. Symp. Plasma Chem. 1989, 2, 95, Kanazawa et al, Nuclear Instruments and Methods in Physical Research 1989, B37/38, 842, and Yokoyama et al., J. Phys. D: Appl. Phys. 1990, 23, 374).

However, adoption of plasma technology has been limited by a major constraint on most industrial plasma systems, namely, their need to operate at low pressure. Partial vacuum operation means a closed perimeter, sealed reactor system providing only off-line, batch processing of discrete work pieces. Throughput is low or moderate and the need for vacuum adds capital and running costs.

Atmospheric pressure plasmas, however, offer industry open port or perimeter systems providing free ingress into and exit from the plasma region by workpieces/webs and, hence, on-line, continuous processing of large or small area webs or conveyor-carried discrete webs. Throughput is high, reinforced by the high species flux obtained from high pressure operation. Many industrial sectors, such as textiles, packaging, paper, medical, automotive, aerospace, etc., rely almost entirely upon continuous, on-line processing so that open port/perimeter configuration plasmas at atmospheric pressure offer a new industrial processing capability.

Corona and flame (also a plasma) treatment systems have provided industry with a limited form of atmospheric pressure plasma processing capability for about 30 years. However, despite their high manufacturability, these systems have failed to penetrate the market or be taken up by industry to anything like the same extent as the lower pressure, bath-processing-only plasma type. The reason is that corona/flame systems have significant limitations. They operate in ambient air offering a single surface activation process and have a negligible effect on many materials and a weak effect on most. The treatment is often non-uniform and the corona process is incompatible with thick webs or 3D webs while the flame process is incompatible with heat sensitive powdered substrates.

Significant advances have been made in plasma deposition at atmospheric pressure. Considerable work has been done on the stabilisation of atmospheric pressure glow discharges, such as described in Okazaki et al. J. Phys. D: Appl. Phys. 26 (1993) 889-892. Further, U.S. patent specification No. 5414324 describes the generation of a steady-state glow discharge plasma at atmospheric pressure between a pair of electrically insulated metal plate electrodes spaced up to 5 cm apart and radio frequency (RF) energised with a root means square (rms) potential of 1 to 5 kV at 1 to 100 kHz.

The treatment of powdered substrates using atmospheric pressure plasma has been previously described. In JP 06-000365 there is provided an apparatus for continuously plasma treating a powdered substrate by coaxially pivoting a metallic inner and outer cylinders at least one side of the outer cylinder being coated with a dielectric to form a fixed gap between the cylinders, inclining the cylinders and passing a voltage across the electrodes to effect the atmospheric pressure plasma treatment of a powdered substrate. In JP 06-228739 there is provided a means for surface treating a powdered substrate by atmospheric-pressure glow discharge by gas floating the powdered substrate with a rare gas or mixture of a rare gas and a gaseous reactant. The treatment occurs in a substantially cylindrical vertical positioned reaction vessel at the bottom of which gas is introduced to float the powdered substrate and the exit is out of the top of the vessel carried by the gas having been first subjected to and atmospheric-pressure glow discharge at a pressure higher than atmospheric pressure. In U.S. Pat. No. 5,399,832 there is provided a method for treating and/or coating an organic or inorganic powdered substrate using an organic monomer using atmospheric pressure glow discharge. In WO 97/29156 there is provided a method of treating deagglomerated particles with plasma activated gas to modify the surface of the particles and species.

All of the aforementioned prior art relate to the activation of the powdered substrate or applications of coatings using gas phase precursors and typically the results suggest low deposition rates and require high residence times to obtain a sufficiently coated surface.

DETAILED DESCRIPTION OF THE INVENTION

In accordance with a first embodiment of the present invention there is provided a method of forming a coating on a powdered substrate, which method comprises introducing an atomized liquid and/or solid coating forming material and separately transporting a powdered substrate to be coated into an atmospheric plasma discharge and/or an ionized gas stream resulting therefrom, and exposing the powdered substrate to the atomized liquid and/or solid coating forming material.

For the purposes of this application a powdered substrate should be considered as a solid material in the form of spherical particles, platelets, needles/tubes, flakes, dust, granulates and any aggregates of the aforementioned forms. The powdered substrate may be transported relative to the plasma region, i.e. the region wherein it is treated by an atmospheric plasma discharge and/or an ionised gas stream resulting therefrom by any suitable means, for example it may be merely dropped under gravity through the plasma zone or may be transported therethrough on a support or the like for example it may be transported through the plasma zone in the form of a fluidised bed, on a conveying means such as on a reel to reel support, conveyor belt or vibrating conveyor. Alternatively the powdered substrate may be entrained on a carrier gas or transported in a vortex or dual cyclone type apparatus, in which case the powder to be treated may be fed in from either the top or bottom of the plasma chamber. The powder may also be suspended in a fluid bed arrangement within the plasma chamber. In the case of a reel-to-reel web support, the powdered substrate may be first placed on a web of material and then a second covering applied and the edges of the two webs are sealed together to prevent loss of powdered substrate from the web. Alternatively the powdered substrate may be maintained stationary in a suitable receptacle, in which case, the plasma unit generating the atmospheric plasma discharge and/or an ionised gas stream is moved relative to the receptacle. Whichever means of transportation is utilized it is preferred that the exposure time in which powdered substrate is retained within the atmospheric plasma discharge and/or an ionized gas stream is constant in order to ensure an even treatment throughout the powdered substrate being treated.

The liquid and/or solid coating forming material is preferably introduced into the plasma apparatus by way of a liquid and/or solid spray through an atomized or nebulizer as described in the applicants co-pending application WO 02/28548, which was published after the priority date of this application.

The coating-forming material may be atomised using any conventional means, for example an ultrasonic nozzle. The atomizer preferably produces a coating-forming material drop size of from 10 μm to 100 μm, more preferably from 10 μm to 50 μm. Suitable atomizers for use in the method in accordance with the present invention are ultrasonic nozzles from Sono-Tek Corporation, Milton, N.Y., USA or Lechler GmbH of Metzingen Germany. The apparatus which may be utilized in the method in accordance with the present invention may include a plurality of utilized, which may be of particular utility, for example, where the apparatus is to be used to form a copolymer coating on a powdered substrate from two different coating-forming materials, where the monomers are immiscible or are in different phases, e.g. the first is a solid and the second is gaseous or liquid.

Any conventional means for generating an atmospheric pressure plasma glow discharge may be used in the method of the present invention, for example atmospheric pressure plasma jet, atmospheric pressure microwave glow discharge and atmospheric pressure glow discharge. Typically, such means will employ a helium diluents and a high frequency (e.g.>1kHz) power supply to generate a homogeneous glow discharge at atmospheric pressure via a Penning ionisation mechanism, (see for example, Kanazawa et al, J.Phys. D: Appl. Phys. 1988, 21, 838, Okazaki et al, Proc. Jpn. Symp. Plasma Chem. 1989, 2, 95, Kanazawa et al, Nuclear Instruments and Methods in Physical Research 1989, B37/38, 842, and Yokoyama et al., J. Phys. D: Appl. Phys. 1990, 23, 374).

For typical plasma generating apparatus, the plasma is generated within a gap of from 3 mm to 50 mm, for example 5 mm to 25 mm. The generation of steady-state glow discharge plasma at atmospheric pressure is preferably obtained between adjacent electrodes which may be spaced up to 5 cm apart, dependent on the process gas used. The electrodes being radio frequency energised with a root mean square (rms) potential of 1 kV to 100 kV, preferably between 1 kV and 30 kV at 1 kHz to 100 kHz, preferably at 15 kHz to 50 kHz. The voltage used to form the plasma will typically be between 1 kV and 30 kV, most preferably between 2.5 kV and 10 kV however the actual value will depend on the chemistry/gas choice and plasma region size between the electrodes. Whilst the atmospheric pressure glow discharge assembly may operate at any suitable temperature, it preferably will operate at a temperature between room temperature (20° C.) and 70° C. and is typically utilized at a temperature in the region of 30° to 50° C.

The process gas for use in plasma treatment method in accordance with the present invention may be any suitable gas but is preferably an inert gas or inert gas based mixture such as, for example helium, a mixture of helium and argon and an argon based mixture additionally containing ketones and/or related compounds. These process gases may be utilized alone or in combination with potentially reactive gases such as, for example, nitrogen, ammonia, $O_2$, $H_2O$, $NO_2$, air or hydrogen. Most preferably, the process gas will be Helium alone or in combination with an oxidizing or reducing gas. The selection of gas depends upon the plasma processes to be undertaken. When an oxidizing or reducing process gas is required, it will preferably be utilized in a mixture comprising 90-99% noble gas and 1 to 10% oxidizing or reducing gas.

Under oxidising conditions, the present method may be used to form an oxygen containing coating on the powdered substrate. For example, silica-based coatings can be formed on the powdered substrate surface from atomised silicon-containing coating-forming materials. Under reducing conditions, the present method may be used to form oxygen free coatings, for example, silicon carbide based coatings may be formed from atomised silicon containing coating forming materials.

In a nitrogen containing gaseous atmosphere nitrogen atoms or molecules can bind to the powdered substrate surface, and in an atmosphere containing both nitrogen and oxygen, nitrates can bind to and/or form on the powdered substrate surface. Such gases may also be used to pre-treat the powdered substrate surface before exposure to a coating forming substance. For example, oxygen containing plasma treatment of the powdered substrate may provide improved adhesion with the applied coating. The oxygen containing plasma being generated by introducing oxygen containing materials to the plasma such as oxygen gas or water.

The Coating thickness for particles coated by the present process is 1 nm-200 nm. Typically the process gas used is helium.

By introducing coating forming material directly to an atmospheric plasma process that higher deposition rates of coating onto powdered substrate particles may be achieved. The use of direct injection of coating forming material also provides for the use of a wider range of precursor materials, and the coating process is not restricted to gas phase materials or high vapour pressure liquids Whilst the powdered substrate may be only subjected to the coating step in accordance with the present invention, it may also be may be pre or post treated with any appropriate plasma treatment. Typically, in the case of powdered substrates, the most likely are pre-treatments where the powdered substrate surface is cleaned and/or surface activated before coating. Post treatment is likely to involve the application of further coatings. For example, a coating formed on a powdered substrate may be post treated in a range of plasma conditions. For example, siloxane derived coatings may be further oxidised by oxygen containing plasma treatments. The oxygen containing plasma being generated by introducing oxygen containing materials to the plasma such as oxygen gas or water.

Any appropriate combination of plasma treatments may be used, for example the powdered substrate may be passed through a first plasma region to clean and/or activate the surface of the powdered substrate by plasma treating using a helium gas plasma and then through a second plasma region utilised to apply a coating, for example, by application of a liquid and/or solid spray through an atomiser or nebuliser as described in the applicants co-pending application WO 02/28548, which was published after the priority date of this application.

The present invention further provides apparatus for forming a coating on a powdered substrate, which apparatus comprises means for generating an atmospheric pressure plasma discharge within which, in use, the powdered substrate to be coated is introduced, an atomizer for providing an atomized coating-forming material within the plasma discharge, and means for supplying a coating forming material to the atomizer.

The plasma chamber may be orientated vertically, allowing gravity fed processing. For example, if atmospheric pressure glow discharge is employed, using either flat, parallel electrodes, or concentric parallel electrodes, the electrodes may be orientated vertically. In this case, powdered substrate to be treated is introduced at the top of the plasma chamber and passes through the plasma region, where atomized coating forming material is introduced. Polymerization and crosslinking reactions occur within the plasma region to produce powdered substrate particles with well adhered coatings. The coated powdered substrate particles then exit the chamber at the base. Alternatively, atomized liquid and/or solid coating forming material may be introduced into the top of the plasma chamber and polymer particles are formed within the chamber and collected at the base. In both cases, particle flow can be controlled and enhanced by the flow of plasma process gas through the chamber.

In an alternative embodiment the atmospheric pressure plasma assembly utilised in the method of the present invention may comprise a first and second pair of vertically or horizontally arrayed, parallel spaced-apart planar electrodes with at least one dielectric plate between said first pair, adjacent one electrode and at least one dielectric plate between said second pair adjacent one electrode, the spacing between the dielectric plate and the other dielectric plate or electrode of each of the first and second pairs of electrodes forming a first and second plasma region. In this instance, the assembly also comprises a means of transporting a powdered substrate successively through said first and second plasma regions. Most preferably, the electrodes are vertically arrayed.

One means of transporting the powdered substrate may be by a reel to reel based process when the electrodes are vertically arrayed, when horizontally arrayed the means of transport may be any of those described earlier such as on a reel to reel web or conveyor belt.

For vertically arrayed electrodes the powdered substrate may be transported through the first plasma region in an upwardly or downwardly direction. Preferably when the powdered substrate passes through one plasma zone in an upwardly direction and the other in a downwardly direction one or more guide rollers are provided to guide the powdered substrate from the end of the first reel into the first plasma zone, from the first plasma zone to and into the second plasma zone and from the second plasma zone to the second reel or next plasma zone dependent on the number of plasma zones being used. The powdered substrate residence time in each plasma region may be predetermined prior to coating and rather than varying the speed of the powdered substrate, through each plasma zone, the path length a powdered substrate has to travel through each plasma region may be altered such that the powdered substrate may pass through both regions at the same speed but may spend a different period of time in each plasma region due to differing path lengths through the respective plasma regions.

In the case when the electrodes utilized in the present invention are vertically orientated, it is preferred that a powdered substrate be transported through an atmospheric pressure plasma assembly upwardly through one plasma region and downwardly though the other plasma region.

Preferably each powdered substrate needs only to be subjected to one pass through the assembly but if required the powdered substrate may be returned to the first reel for further passages through the assembly.

Additional pairs of electrodes may be added to the system to form further successive plasma regions through which a powdered substrate would pass. The additional pairs of electrodes may be situated before or after said first and second pair of electrodes such that powdered substrate would be subjected to pre-treatment or post-treatment steps. Said additional pairs of electrodes are preferably situated before or after and most preferably after said first and second pairs of electrodes. Treatments applied in the plasma regions formed by the additional pairs of electrodes may be the same or different from that undertaken in the first and second plasma regions. In the case when additional plasma regions are provided for pre-treatment or post-treatment, the necessary number of guides and/or rollers will be provided in order to ensure the passage of the powdered substrate through the assembly. Similarly preferably the powdered substrate will be transported alternatively upwardly and downwardly through all neighbouring plasma regions in the assembly.

Each electrode may comprise any suitable geometry and construction. Metal electrodes may be used and may be in, for example, the form of metallic plates or a mesh. The metal electrodes may be bonded to the dielectric material either by adhesive or by some application of heat and fusion of the metal of the electrode to the dielectric material. Alternatively one or more of the electrodes may be encapsulated within the dielectric material or may be in the form of a dielectric material with a metallic coating such as, for example a dielectric, preferably a glass dielectric with a sputtered metallic coating.

In one embodiment of the invention each electrode is of the type described in the applicants co-pending application WO 02/35576 which was published after the priority date of the present invention wherein there are provided electrode units containing an electrode and an adjacent a dielectric plate and a cooling liquid distribution system for directing a cooling conductive liquid onto the exterior of the electrode to cover a planar face of the electrode. Each electrode unit may comprise a watertight box having a side formed by a dielectric plate having bonded thereto on the interior of the box the planar electrode together with a liquid inlet and a liquid outlet. The liquid distribution system may comprise a cooler and a recirculation pump and/or a sparge pipe incorporating spray nozzles.

Ideally the cooling liquid covers the face of the electrode remote from the dielectric plate. The cooling conductive liquid is preferably water and may contain conductivity controlling compounds such as metal salts or soluble organic additives. Ideally, the electrode is a metal electrode in contact with the dielectric plate. In one embodiment, there is a pair of metal electrodes each in contact with a dielectric plate. The water as well as being an extremely efficient cooling agent to also assists in providing an efficient electrode.

The dielectric materials may be made from any suitable dielectric, examples include but are not restricted to polycarbonate, polyethylene, glass, glass laminates, epoxy filled glass laminates and the like.

The method in accordance with the present invention is particularly suited for coating powdered substrates which are sensitive to other coating processes and are particularly useful for coating powdered substrates which are sensitive to, for example, heat, temperature and UV light. The powdered substrates to be coated may comprise any material, for example metals, metal oxides, silica and silicates, carbon, organic powdered substrates, including polymeric, dyestuffs, fragrances, flavourings, pharmaceutical powdered substrates such as penicillins and antibiotics as well as biologically active compounds for example proteins, including enzymes and other protein based materials.

It is to be understood that the coating forming material in accordance with the present invention is a precursor material which can be used to make any appropriate coating, including, for example, a material which can be used to grow a film or to chemically modify an existing surface. The present invention may be used to form many different types of coatings. The type of coating which is formed on the powdered substrate is determined by the coating-forming material(s) used, and the present method may be used to (co)polymerise coating-forming monomer material(s) onto the powdered substrate surface.

The coating-forming material may be organic or inorganic, solid, liquid or gaseous, or mixtures thereof. Suitable organic coating-forming materials include carboxylates, methacrylates, acrylates, styrenes, methacrylonitriles, alkenes and dienes, for example methyl methacrylate, ethyl methacrylate, propyl methacrylate, butyl methacrylate, and other alkyl methacrylates, and the corresponding acrylates, including organofunctional methacrylates and acrylates, including glycidyl methacrylate, trimethoxysilyl propyl methacrylate, allyl methacrylate, hydroxyethyl methacrylate, hydroxypropyl methacrylate, dialkylaminoalkyl methacrylates, and fluoroalkyl (meth)acrylates, methacrylic acid, acrylic acid, fumaric acid and esters, itaconic acid (and esters), maleic anhydride, styrene, $\alpha$-methylstyrene, halogenated alkenes, for example, vinyl halides, such as vinyl chlorides and vinyl fluorides, and fluorinated alkenes, for example perfluoroalkenes, acrylonitrile, methacrylonitrile, ethylene, propylene, allyl amine, vinylidene halides, butadienes, acrylamide, such as N-isopropylacrylamide, methacrylamide, epoxy compounds, for example glycidoxypropyltrimethoxysilane, glycidol, styrene oxide, butadiene monoxide, ethyleneglycol diglycidylether, glycidyl methacrylate, bisphenol A diglycidylether (and its oligomers), vinylcyclohexene oxide, conducting polymers such as pyrrole and thiophene and their derivatives, and phosphorus-containing compounds, for example dimethylallylphosphonate.

Suitable inorganic coating-forming materials include metals and metal oxides, including colloidal metals. Organometallic compounds may also be suitable coating-forming materials, including metal alkoxides such as titanates, tin alkoxides, zirconates and alkoxides of germanium and erbium. However, the present inventors have found that the present invention has particular utility in providing powdered substrates with silica- or siloxane-based coatings using coating-forming compositions comprising silicon-containing materials. Suitable silicon-containing materials for use in the method of the present invention include silanes (for example, silane, alkylsilanes, alkylhalosilanes, alkoxysilanes) and linear (for example, polydimethylsiloxane) and cyclic siloxanes (for example, octamethylcyclotetrasiloxane), including organo-functional linear and cyclic siloxanes (for example, Si—H containing, halo-functional, and haloalkyl-functional linear and cyclic siloxanes, e.g. tetramethylcyclotetrasiloxane and tri(nonofluorobutyl)trimethylcyclotrisiloxane). A mixture of different silicon-containing materials may be used, for example to tailor the physical properties of the powdered substrate coating for a specified need (e.g. thermal properties, optical properties, such as refractive index, and viscoelastic properties).

In addition, under oxidizing conditions the present method may be used to form an oxygen containing coating on the powdered substrate. For example, silica-based coatings can be formed on the powdered substrate surface from atomized silicon-containing coating-forming materials. Under reducing conditions, the present method may be used to form oxygen free coatings, for example, silicon carbide based coatings may be formed from atomised silicon containing coating forming materials.

Plasma generating conditions containing gases other than oxygen may also be employed, for example noble gases, air, hydrogen, nitrogen and ammonia. In a nitrogen containing atmosphere nitrogen can bind to the powdered substrate surface, and in an atmosphere containing both nitrogen and oxygen, nitrates can bind to and/or form on the powdered substrate surface. Such gases may also be used to pre-treat the powdered substrate surface before exposure to the coating forming substance. For example, oxygen containing plasma treatment of the powdered substrate may provide improved adhesion with the applied coating. The oxygen containing plasma being generated by introducing oxygen containing materials to the plasma such as oxygen gas or water. Furthermore, the coating formed on the powdered substrate may be post treated in a range of plasma conditions. For example, siloxane derived coatings may be further oxidised by oxygen containing plasma treatment. The oxygen containing plasma being generated by introducing oxygen containing materials to the plasma such as oxygen gas or water.

An advantage of the present invention over the prior art is that both liquid and solid atomized coating-forming materials may be used to form coatings on powdered substrates, due to the method of the present invention taking place under conditions of atmospheric pressure. Furthermore the coating-forming materials can be introduced into the plasma discharge or resulting stream in the absence of a carrier gas, i.e. they can be introduced directly by, for example, direct injection, whereby the coating forming materials are injected directly into the plasma.

As mentioned above, the present inventors have found particular utility of the present invention for forming silica- and siloxane-based coatings on powdered substrates using silicon-containing materials. Under oxidising conditions, e.g. an oxygen containing atmosphere, silica-like coatings can be formed on the powdered substrate surface from atomised silicon-containing materials, whereas under non-oxidizing conditions, a siloxane polymer, e.g. a linear, branched or resinous siloxane polymer, can be formed on the powdered substrate surface from atomization of a silicon-containing monomer. A siloxane-organic copolymer can be formed on the powdered substrate surface by use of a mixture of organic and silicon-containing monomers. However, the present invention is also useful for forming an organic coating on a powdered substrate, for example a polyacrylic acid or perfluoro-organic coating.

Powdered substrates coated by the method of the present invention may have various utilities. For example, a silica based coating may give encapsulation through enhanced barrier (oxygen and/or moisture) properties and controlled release properties to an organic particle such as a fragrance, flavour, pharmaceutical or dyestuff. Improved compatibility could be achieved for metal or metal oxide powders used as reinforcing or property modifying fillers in rubbers and plastics. Improved compatibility may also be utilised for dispersions such as dyestuffs/pigments, antioxidants and UV stabilisers in polymer materials and also formulated products such as paints and cosmetics. Powder processing may be improved by enhancing characteristics such as flow, compatibility and electrostatic properties. Specific functionalities may be added to catalysts and catalyst support to enhance or control reactivity. Also surface and pore properties of powders used as separation media or as support for separation media may be controlled.

In one embodiment of the invention a statically electric charged porous plate or a vibrating sieve may be placed in line with the exit of the powdered substrate from the plasma region to collect the resulting powdered substrate.

FIGURES

The present invention will now be described further on the basis of the following examples and drawings in which.

Figure 1:
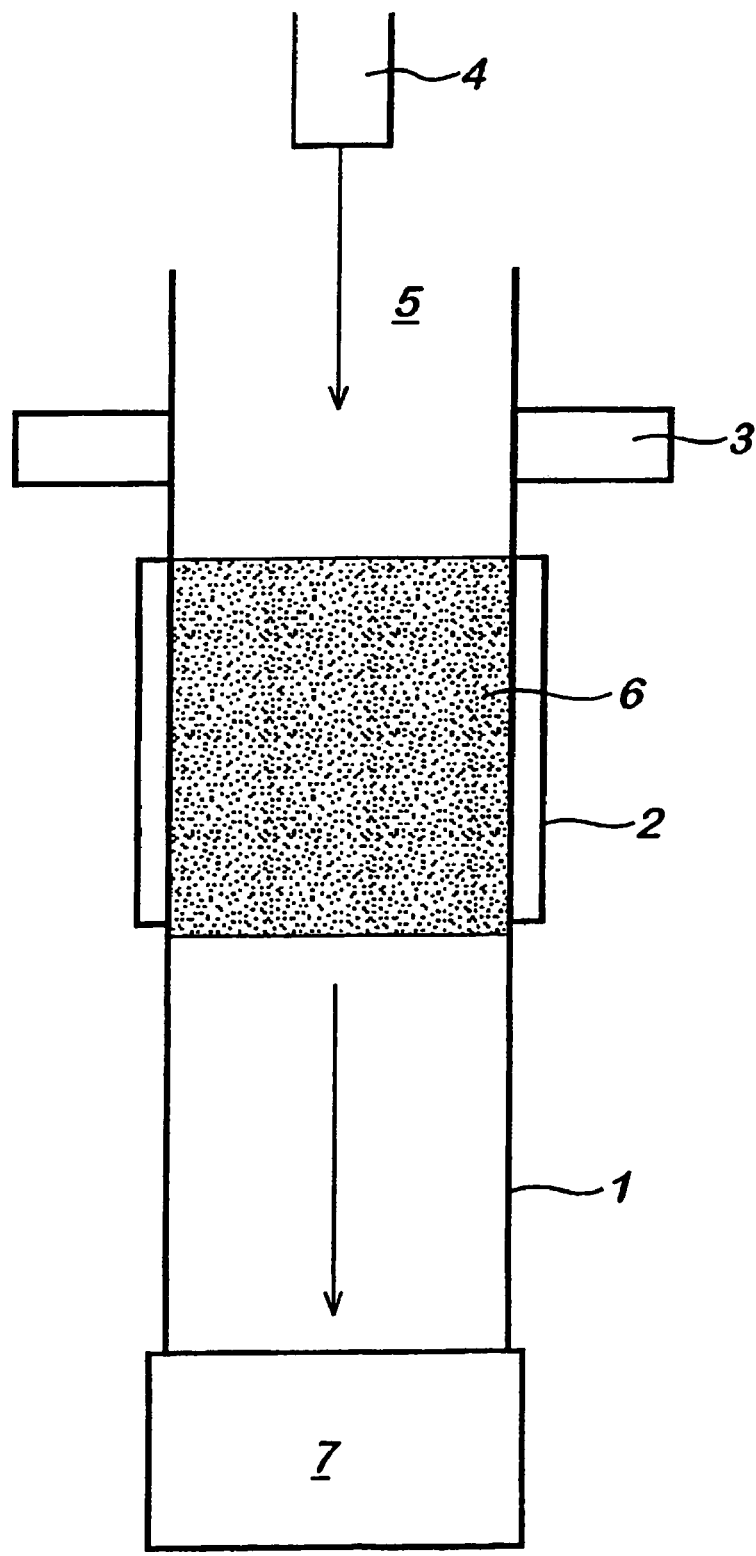
FIG. 1 shows a plan view of an embodiment of the invention where the powdered substrate is transported through the plasma region by gravity.

In a First embodiment as shown in FIG. 1 there is provided an atmospheric pressure glow discharge apparatus for powdered substrate treatment which relies upon gravity for transport of the powdered substrate through the atmospheric pressure glow discharge apparatus. The apparatus comprises a casing made of a dielectric material such as polypropylene, a pair of parallel electrodes 2, an atomiser nozzle 3 for the introduction of the coating making material, a means for powdered substrate delivery 4 and a collector for the resulting coated powdered substrate. In use, a process gas, typically helium, is introduced into top of the column and an appropriate potential difference is applied between the electrodes to affect a plasma therebetween as identified by the plasma region 6. Appropriate amounts of the powdered substrate from delivery means 4 and coating making material is introduced by way of nozzle 3. Typically the coating making material is in the form of an atomized liquid and/or solid and as such both the uncoated powdered substrate are introduced into the assembly above the plasma zone 6 and rely upon gravity to feed powdered substrate and coating forming material through the plasma region 6 with coated powdered substrate being collected in collector 7.

Figure 2:
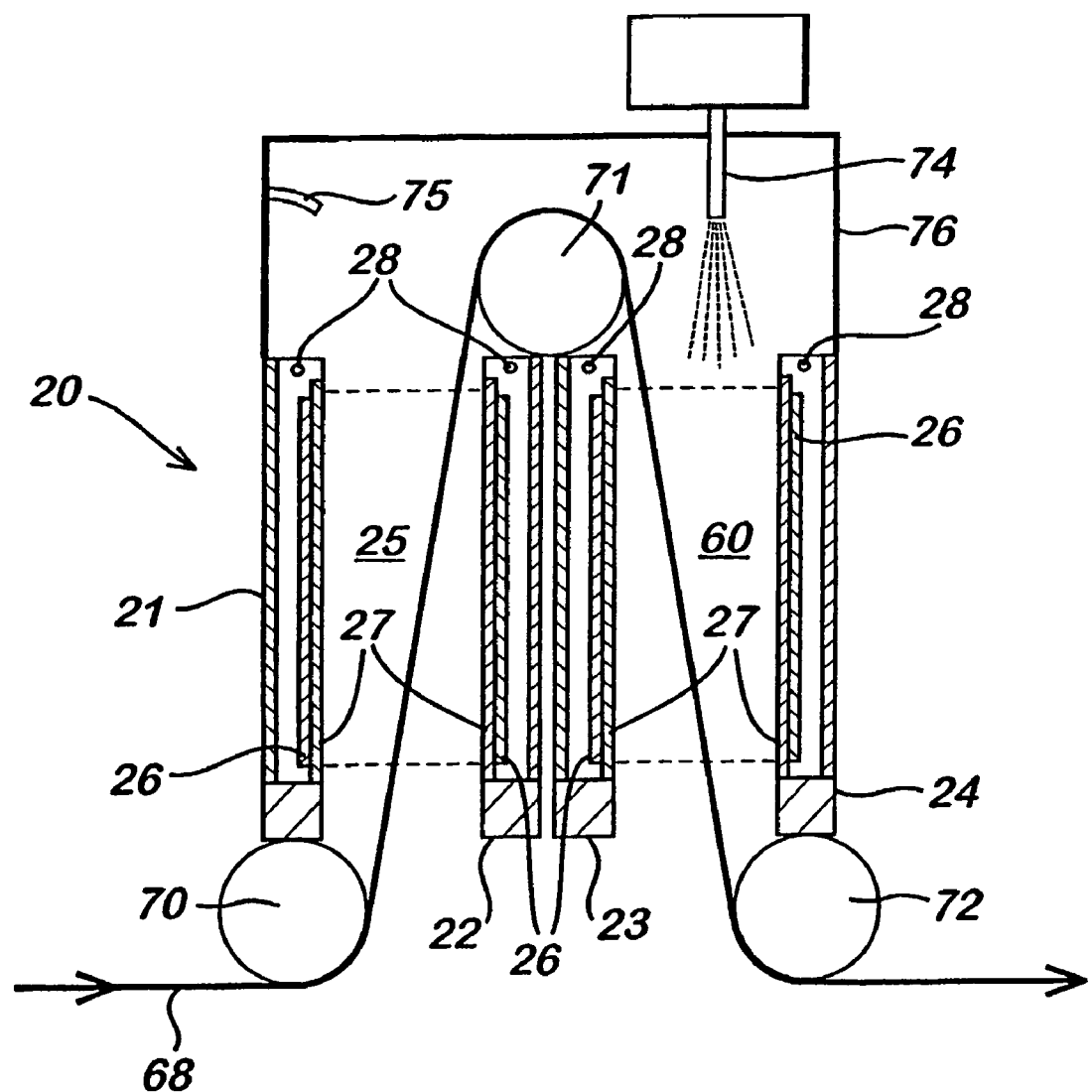
FIG. 2 shows a plan view of an alternative embodiment by which the powdered substrate is transported through the plasma regions on a reel to reel web.

An alternative embodiment is depicted in FIG. 2 in which there is provided a flexible web which acts a support for the powdered substrate to be treated in accordance with the present invention. A means of transporting the web through the atmospheric pressure glow discharge assembly generally depicted as 20 is provided in the form of guide rollers 70, 71 and 72. Atmospheric pressure glow discharge assembly 20 comprises two pairs of electrodes 21, 22 and 23, 24 respectively, which in use will generate plasma zones 25 and 60. Each electrode 21, 22, 23 and 24 comprises a watertight box, typically made of a dielectric material such as polypropylene. Each watertight box comprises a steel mesh electrode 26, fixed to a glass dielectric material 27 and a sparge pipe inlet 28 for spraying water on to the rear face of the mesh electrode. The assembly also comprises a process gas inlet 75, an assembly lid 76 and an ultrasonic nozzle 74 for introducing an atomised liquid into plasma region 60.

In use a flexible web 68 on which is retained the powdered substrate is transported to and over guide roller 70 and is thereby guided through plasma region 25 between electrodes 21 and 22. The plasma produced in plasma region 25 may be a cleaning and/or activating helium plasma, i.e. no reactive agent is directed into plasma region 25, or alternatively region 25 may be used as a helium purge zone, i.e. the plasma in this zone is not ignited. The helium is introduced into the system by way of inlet 75. Lid 76 is placed over the top of the system to prevent the escape of helium as it is lighter than air. Upon leaving plasma region 25 the web containing the plasma cleaned powdered substrate passes over guide 71 and is directed down through plasma region 60, between electrodes 23 and 24 and over roller 72. Plasma region 60 generates a coating for the powdered substrate by means of the injection of a reactive agent in the form of a liquid coating making material through ultrasonic nozzle 74. The atomised liquid travels under gravity through plasma region 60 and is kept separate from plasma region 25 and as such, no coating occurs in plasma region 25. The powdered substrate is coated whilst being transported through plasma region 60 and then is transported over roller 72 and is collected or further treated with additional plasma treatments. Rollers 70 and 72 may be reels as opposed to rollers. Having passed through is adapted to guide the powdered substrate into plasma region 25 and on to roller 71.

EXAMPLE 1

The following example describes the plasma treatment of a rice hull ash sold under the name Ricesil™ (Rice Chemistry Inc. of Stuttgart, Ariz., USA), which is a biogenic amorphous silica, in accordance with the embodiment described in FIG. 2. In this example the distance between the glass dielectric plates attached to the two electrodes was 6 mm and the surface area of each electrode was (10 cm×50 cm). The process gas used was helium. An atmospheric pressure glow discharge was generated by applying RF power of 1 W/cm$^2$ to two electrodes with a frequency of 29 kHz. The operating temperature was below 40° C. The powdered substrate was passed through both the first and second plasma zones using a reel-to-reel mechanism of the type described in FIG. 2 with a guide means being utilised to assist in the transport of the powdered substrate out of the first and into the second plasma regions. The speed of the powdered substrate passing through both plasma zones was 1 m min$^{-1}$. The rice hull ash was placed onto a polyester non-woven fabric and another piece of the same non-woven fabric was placed on top of the powdered substrate to form a non-woven fabric envelope. The edges of the envelope formed by the two pieces of non-woven fabric were then sealed.

Tetramethylcyclotetrasiloxane (TMCTS) was supplied to an ultrasonic nozzle at a flow rate of 300 microliters per minute. TMCTS droplets were discharged from the ultrasonic nozzle above the atmospheric pressure glow discharge. These TMCTS droplets passed through the atmospheric pressure glow discharge at the same time as the non-woven fabric envelope containing the a rice hull ash. The resulting treated rice hull ash was collected after the above treatment and was subjected to the following test.

Test to assess the hydrophobicity of plasma treated and non-plasma treated rice hull ash using Water/isopropyl alcohol (IPA)solutions Solutions of water and IPA were made up in the ratios indicated in Table 1and then samples of untreated Rice Hull Ash (0.100g) and TMCTS treated Rice Hull Ash (0.100g) were introduced into each solution using a spatula, with a view to assessing the degree of hydrophobicity of the treated particles. The samples were then shaken for 1 min and allowed to settle for 1 min. Samples which wet and sink to the bottom were identified as hydrophilic, samples where all the powder returned to the upper surface of the liquid were identified as hydrophobic and samples where some of the powder returned to the surface and some settled as sediment or stayed in suspension were identified as intermediate in Table 1 below.

TABLE 1

| Solution Used | Untreated Rice Hull Ash | TMCTS Treated Rice Hull Ash |
| --- | --- | --- |
| HPLC Water | Wets and sinks | Hydrophobic |
| Water: IPA 5% soln | Wets and sinks | Hydrophobic |
| Water: IPA 10% soln | Wets and sinks | Hydrophobic |
| Water: IPA 15% soln | Hydrophilic | Intermediate |
| Water: IPA 20% soln | Hydrophilic | Intermediate |
| Water: IPA 30% soln | Hydrophilic | Wets Hydrophilic |

Figure 3A:
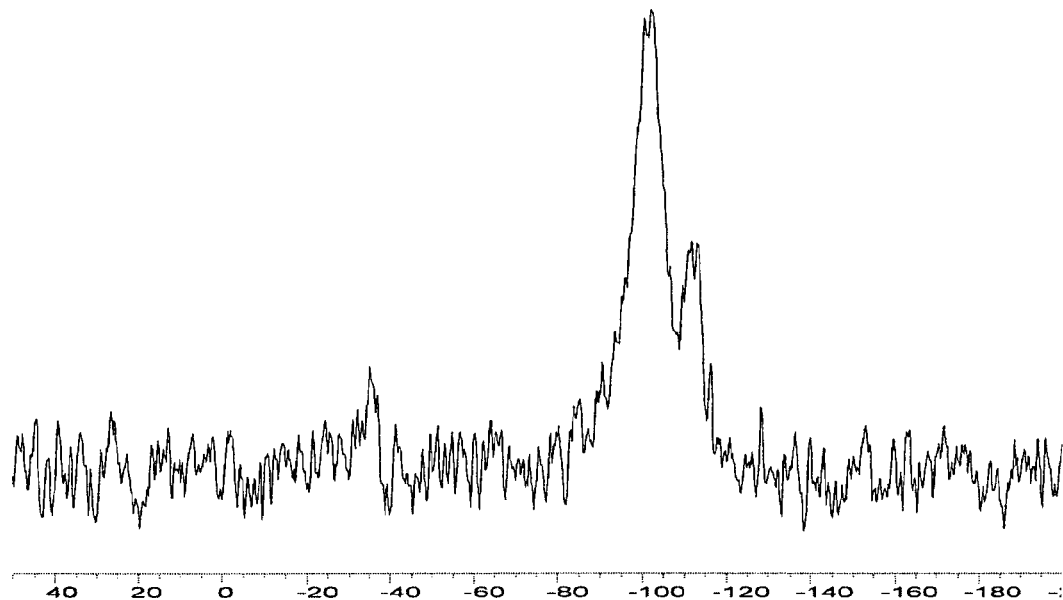
FIG. 3a is the $^{29}$Si solid state NMR spectrum of uncoated rice hull ash and FIG. 3b is $^{29}$Si solid state NMR spectrum of the coated rice hull ash as described in Example 1.
Figure 3B:
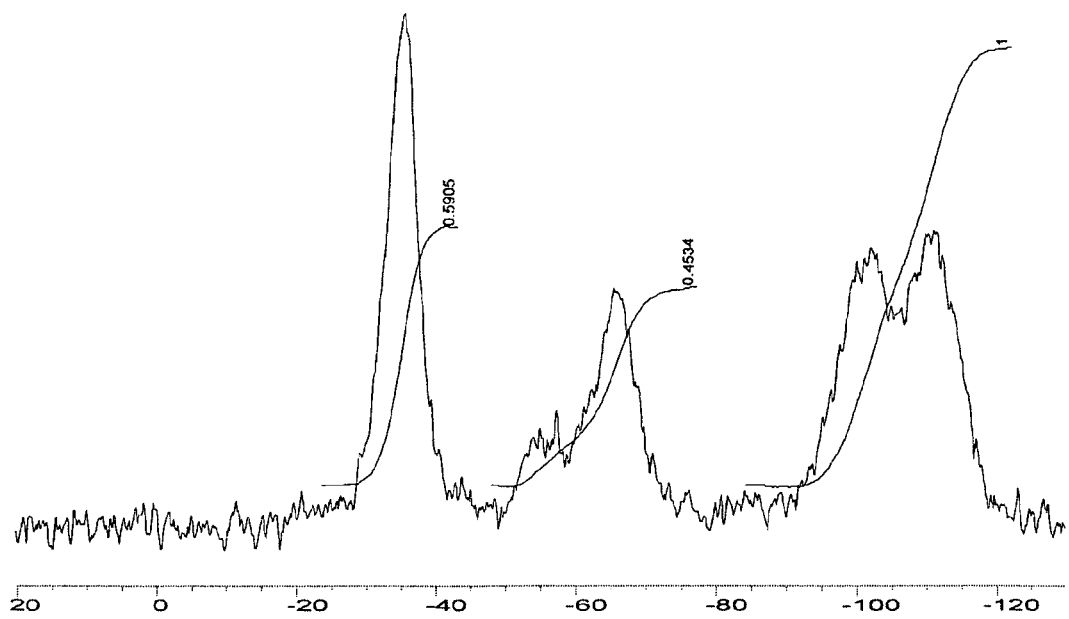

$^{29}$Si solid state NMR spectra of the untreated Rice hull ash and treated rice hull ash are shown in FIGS. 3a and 3b respectively. The process used for both samples was CPMAS—Cross Polarisation Magic Angle Spinning, Speed 5 KHz, cross polarization time 5 ms, Pulse delay 5 secs.

In the case of the untreated Rice hull ash (FIG. 3a) the main peak observed at −101.6 ppm was due to the presence of SiO$_{3/2}$OH groups (Q3 silica species) and the shoulder to main peak observed at −112.2 ppm was due to SiO$_{4/2}$ groups, (silica Q4 species), clearly indicating that untreated Rice hull ash is a form of silica.

In the case of the treated Rice hull ash (FIG. 3b) the peaks were assigned as follows:

| Peak Shift (centre) | Assignment |
| --- | --- |
| −35.05 | MeHSiO$_{2/2}$ (D$^H$ - polymer) |
| −55.13 | MeSiO$_{2/2}$OR (T2 where R = H or aliphatic) |
| −65.66 | MeSiO$_{3/2}$ (T3 units) |
| −101.34 | SiO$_{3/2}$OH (Q3 units) |
| −110.60 | SiO$_{4/2}$ (Q4 units) |

Peaks from D$^H$, T2 and T3 originate from the cyclic monomer. The broad peak centred −101.3 has reduced significantly in intensity compared to the equivalent peak observed in FIG. 3a. This is direct evidence that the cyclic has treated the Rice hull ash silica.

The invention claimed is:

1. A method of forming a coating on a powdered substrate, which method comprises introducing, by direct injection, at least one of an atomized liquid and solid coating forming material into at least one of an atmospheric plasma discharge and an ionised gas stream resulting therefrom, and separately transporting a powdered substrate to be coated into at least one of the atmospheric plasma discharge and the ionised gas stream resulting therefrom, and exposing the powdered substrate to the at least one of atomized liquid and solid coating forming material, wherein the powdered substrate is transported by being carried on a reel to reel web support comprising two layers of a non-woven fabric material between which, in use, the powdered substrate is sandwiched.

2. A method in accordance with claim 1 wherein the powdered substrate to be coated is selected from at least one of metals, metal oxides, silica and silicates, carbon, polymeric powdered substrates, dyestuffs, fragrances, flavouring powdered substrates, pharmaceutical powdered substrates and biologically active powdered compounds.

3. A method in accordance with claim 2 wherein the atmospheric plasma discharge is generated between spaced apart parallel electrodes which are either flat electrodes or concentric electrodes.

4. A method in accordance with claim 3 wherein the spaced apart parallel electrodes are further defined as flat electrodes.

5. A method in accordance with claim 3 wherein the spaced apart parallel electrodes are further defined as concentric parallel electrodes.

6. A method in accordance with claim 2 wherein the atmospheric plasma discharge is generated between a first and second pair of vertically or horizontally arrayed, parallel spaced-apart planar electrodes (21, 22, 23, 24) with at least one dielectric plate (27) between the first pair (21, 22), adjacent one electrode and at least one dielectric plate (27) between the second pair (23, 24) adjacent one electrode, the spacing between the dielectric plate (27) and the other dielectric plate or electrode of each of the first and second pairs of electrodes forming a first and second plasma region (25, 60).

7. A method in accordance with claim 6 wherein the electrodes (21, 22, 23, 24) are vertically arrayed.

8. A method in accordance with claim 7 wherein each electrode (21, 22, 23, 24) is in the form of a watertight box having a side formed by a dielectric plate (27) having bonded thereto on the interior of the box a planar electrode (26) together with a liquid inlet (28) adapted to spray water or an aqueous solution onto the face of the planar electrode (26).

9. A method in accordance with claim 6 wherein each electrode (21, 22, 23, 24) is in the form of a watertight box having a side formed by a dielectric plate (27) having bonded thereto on the interior of the box a planar electrode (26) together with a liquid inlet (28) adapted to spray water or an aqueous solution onto the face of the planar electrode (26).

10. A method in accordance with claim 1 wherein the atmospheric plasma discharge is generated between spaced apart parallel electrodes which are either flat electrodes or concentric electrodes.

11. A method in accordance with claim 10 wherein the spaced apart parallel electrodes are further defined as flat electrodes.

12. A method in accordance with claim 10 wherein the spaced apart parallel electrodes are further defined as concentric parallel electrodes.

13. A method in accordance with claim 1 wherein the atmospheric plasma discharge is generated between a first and second pair of vertically or horizontally arrayed, parallel spaced-apart planar electrodes (21, 22, 23, 24) with at least one dielectric plate (27) between the first pair (21, 22), adjacent one electrode and at least one dielectric plate (27) between the second pair (23, 24) adjacent one electrode, the spacing between the dielectric plate (27) and the other dielectric plate or electrode of each of the first and second pairs of electrodes forming a first and second plasma region (25, 60).

14. A method in accordance with claim 13 wherein the electrodes (21, 22, 23, 24) are vertically arrayed.

15. A method in accordance with claim 14 wherein each electrode (21, 22, 23, 24) is in the form of a watertight box having a side formed by a dielectric plate (27) having bonded thereto on the interior of the box a planar electrode (26) together with a liquid inlet (28) adapted to spray water or an aqueous solution onto the face of the planar electrode (26).

16. A method in accordance with claim 13 wherein each electrode (21, 22, 23, 24) is in the form of a watertight box having a side formed by a dielectric plate (27) having bonded thereto on the interior of the box a planar electrode (26) together with a liquid inlet (28) adapted to spray water or an aqueous solution onto the face of the planar electrode (26).

* * * * *